United States Patent [19]
Ito

[11] Patent Number: 5,449,954
[45] Date of Patent: Sep. 12, 1995

[54] INTERCONNECTION STRUCTURE WITH TiON LAYERS

[75] Inventor: Masahiko Ito, Kanagawa, Japan

[73] Assignee: Sony Corporation, Tokyo, Japan

[21] Appl. No.: 193,531

[22] Filed: Feb. 8, 1994

[30] Foreign Application Priority Data

Feb. 15, 1993 [JP] Japan .................. 5-025581

[51] Int. Cl.⁶ .............................. H01L 21/28
[52] U.S. Cl. ...................... 257/751; 257/763; 257/764
[58] Field of Search .............. 257/751, 763, 762, 764, 257/765

[56] References Cited

U.S. PATENT DOCUMENTS 5,202,579  4/1993  Fujii et al. ................. 257/751
5,305,519  4/1994  Yamamoto et al. ............... 29/852

FOREIGN PATENT DOCUMENTS 4-27163  1/1992  Japan .

*Primary Examiner*—William Mintel
*Assistant Examiner*—Roy Potter
*Attorney, Agent, or Firm*—Hill, Steadman & Simpson

[57] ABSTRACT

An interconnection structure for integrated semiconductor circuits has a Ti layer disposed on a semiconductor substrate, a TiON layer disposed on the Ti layer, and a TiN layer disposed on the TiON layer. A metallic interconnection layer containing Al is disposed on the TiN layer. The TiON layer is effective to prevent Al in the metallic interconnection layer and Si in the semiconductor substrate from being mutually diffused. The metallic interconnection layer can deposited, with a good coverage, in a connecting hole defined in an interlayer insulating layer on the substrate.

3 Claims, 2 Drawing Sheets

INTERCONNECTION STRUCTURE WITH TiON LAYERS

BACKGROUND OF THE INVENTION

1. Field of the Invention

The present invention relates to an interconnection structure for use in electronic devices including integrated semiconductor circuits such as a VLSI circuit, a ULSI circuit, or the like, and a method of manufacturing such an interconnection structure.

2. Description of the Related Art

To meet requirements for smaller sizes and higher packing densities, electronic devices including integrated semiconductor circuits such as a VLSI circuit, a ULSI circuit, or the like incorporate a multilayer interconnection structure including interconnections and electrodes (hereinafter collectively referred to as "interconnections") with interlayer insulating layers disposed therebetween. Efforts are being made to increase the density of and reduce the pattern of interconnections in electronic devices to meet demands for electronic devices of much smaller sizes and higher packing densities.

Interconnections on an upper surface of interlayer insulating layer are connected, by way of ohmic contact, through connecting holes such as contact holes or via holes defined in the interlayer insulating layer to other interconnections or semiconductor regions (hereinafter referred to as "contact regions") such as impurity-diffused regions of Si semiconductors beneath the interlayer insulating layer. The connecting holes are also required to be smaller in diameter.

It is necessary that the interlayer insulating layers have a certain thickness in order to provide a desired level of electric reliability and avoid the problem of parasitic capacitance. Consequently, the aspect ratio (depth/diameter) of the connecting holes is relatively large.

If a metallic interconnection layer containing Al, e.g., Al—Si with 1% of Si or Al—Si—Cu, is connected, by way of ohmic contact, to a contact region through a connecting hole having a relatively large aspect ratio, then a barrier metal layer is employed as a base layer for the metallic interconnection layer.

One conventional structure having a metallic interconnection layer containing Al which is connected to a contact region through ohmic contact through a connecting hole is illustrated in FIG. 1 of the accompanying drawings.

As shown in FIG. 1, an interconnection or conducting path is connected to a contact region which comprises a semiconductor region 2 of an Si semiconductor substrate 1 through a connecting hole 4 defined in an interlayer insulating layer 3 deposited on the Si semiconductor substrate 1. More specifically, a barrier metal layer is deposited on the interlayer insulating layer 3 including the connecting hole 4 by sputtering or the like. The barrier metal layer is composed of a Ti layer 5 which well adheres to Si, for example, of the semiconductor region 2, and a TiON layer 6 which prevents Al of the interconnection from spiking the Si semiconductor substrate 1. An interconnection or conducting path 7 containing Al is deposited on the barrier metal layer by sputtering or the like.

A thermally oxidized device-separating thick insulating layer 8, i.e., LOCOS, is formed on the Si semiconductor substrate 1. A channel-stop region 9 of a high impurity concentration is disposed on the Si semiconductor substrate 1 beneath the thick insulating layer 8.

With the arrangement shown in FIG. 1, however, the wettability of the interconnection layer 7 containing Al with the TiON layer 6 is poor. Therefore, as indicated at a in FIG. 1, a region which is not covered with the interconnection layer 7, i.e., with a coverage of 0% or nearly 0%, is produced, causing electrical and mechanical reliability problems.

One solution is to deposit a TiN layer 16 in place of the TiON layer 6 in the barrier metal layer to provide better wettability with the interconnection layer 7 containing Al. While the TiN layer 16 well adheres to the interconnection layer 7, i.e., its electrical and mechanical reliability is higher, the barrier capability of the TiN layer 16 is lower. Specifically, when the assembly is heated to 400° C. to 500° C. after the interconnection layer 7 has been deposited, it is necessary for the TiN layer 16 to have a large thickness of 115 nm, for example, in order to reliably prevent Al of the interconnection layer 7 from spiking the semiconductor region 2, for example, which is formed in the semiconductor substrate 1 by mutual diffusion of Si therefrom. Therefore, even if the connecting hole 4 has a reduced effective diameter, the connecting hole 4 may not be covered well with the interconnection layer 7 particularly when the aspect ratio of the connecting hole 4 is large.

OBJECTS AND SUMMARY OF THE INVENTION

It is therefore an object of the present invention to provide an interconnection structure having an interconnection layer containing Al that is formed highly reliably with a better coverage.

Another object of the present invention is to provide a method of manufacturing such an interconnection structure.

According to the present invention, there is provided an interconnection structure comprising a substrate, a Ti layer disposed on the substrate, a TiON layer disposed on the Ti layer, a TiN layer disposed on the TiON layer, and a metallic interconnection layer containing Al which is disposed on the TiN layer.

According to the present invention, there is also provided an interconnection structure comprising a substrate, a Ti layer disposed on the substrate, a lower TiN layer disposed on the Ti layer, a TiON layer disposed on the lower TiN layer, an upper TiN layer disposed on the TiON layer, and a metallic interconnection layer containing Al which is disposed on the upper TiN layer.

The metallic interconnection layer may be made of Al and 1% of Si or Al—Si—Cu.

According to the present invention, there is further provided a method of manufacturing an interconnection structure, comprising the steps of depositing a Ti layer and a lower TiN layer successively in the order named on a substrate, thermally oxidizing a surface of the lower TiN layer into a TiON layer, depositing an upper TiN layer on the TiON layer, and depositing a metallic interconnection layer containing Al on the upper TiN layer.

The TiN layer which has good wettability with the metallic interconnection layer containing Al is disposed beneath the metallic interconnection layer. Therefore, the metallic interconnection layer is held in contact with the TiN layer therebeneath with high mechanical and electrical reliability.

Since the TiON layer having a good barrier capability is included for effectively preventing Al in the metallic interconnection layer and Si in the substrate from being mutually diffused, the thickness of a base layer disposed underneath the metallic interconnection layer containing Al may be reduced, and the metallic interconnection layer containing Al may be deposited in the connecting hole with a good coverage.

The above and other objects, features, and advantages of the present invention will become apparent from the following description of illustrative embodiments thereof to be read in conjunction with the accompanying drawings, in which like reference numerals represent the same or similar objects.

DETAILED DESCRIPTION OF THE PREFERRED EMBODIMENTS

Figure 1:
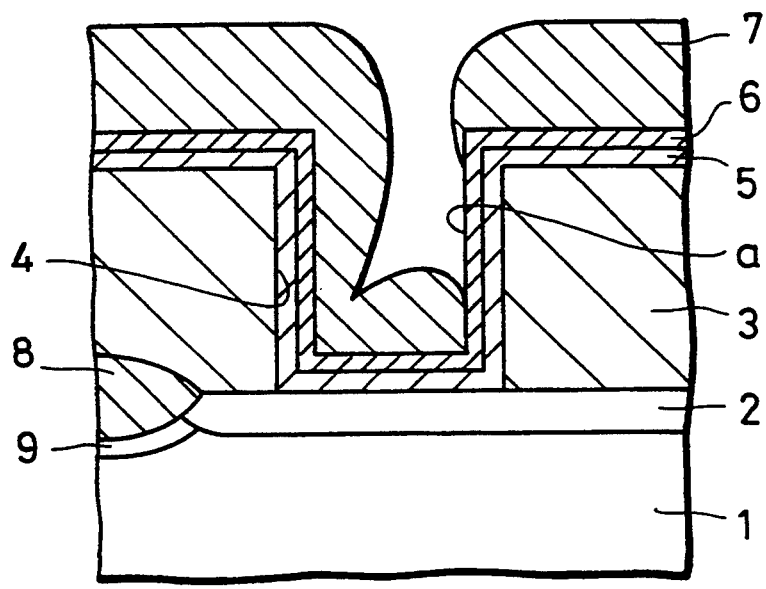
FIG. 1 is a fragmentary cross-sectional view of a conventional interconnection structure.
Figure 2:
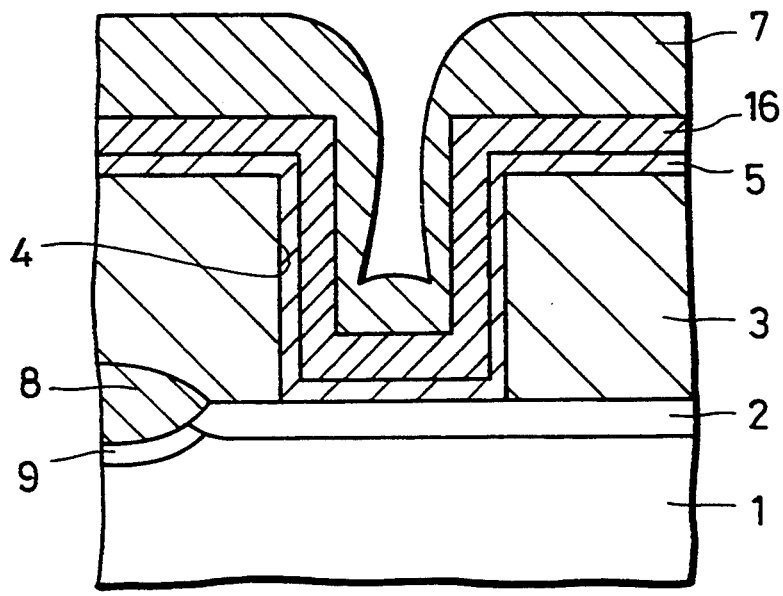
FIG. 2 is a fragmentary cross-sectional view of another conventional interconnection structure.
Figure 3:
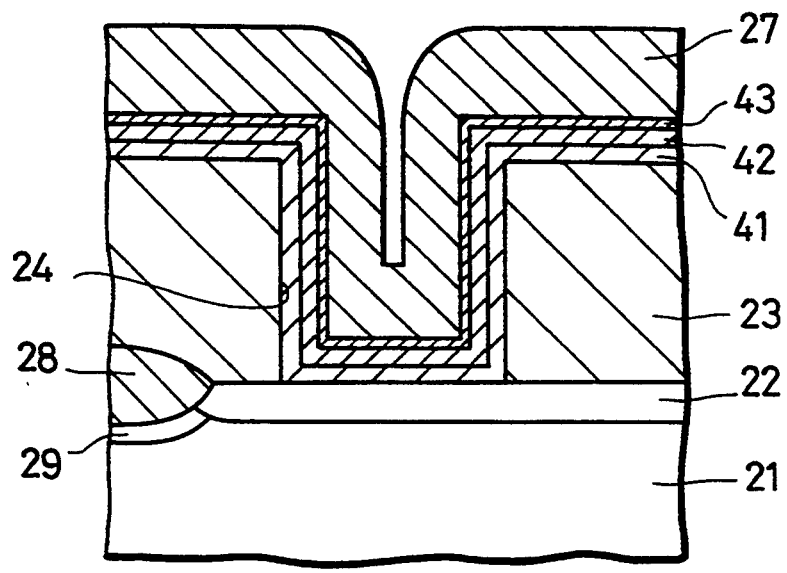
FIG. 3 is a fragmentary cross-sectional view of an interconnection structure according to a first embodiment of the present invention.

As shown in FIG. 3, an interconnection structure according to a first embodiment of the present invention includes a semiconductor substrate 21, e.g., an Si single-crystal semiconductor substrate of a first conductivity type, e.g., a low-concentration p-type, the semiconductor substrate 21 including a semiconductor region 22 as a contact region. The semiconductor region 22 serves as a source or drain region of a MOS transistor (insulated field-effect transistor) that is formed by selective diffusion or ion implantation of an impurity of a second conductivity type, e.g., an n-type. The interconnection structure also includes a metallic interconnection layer 27 containing Al which is connected to the semiconductor region 22 through a connecting hole 24 defined in an interlayer insulating layer 23 that is deposited on the semiconductor substrate 21.

A Ti layer 41, a TiON layer 42, and a TiN layer 43 are deposited successively in the order named on the semiconductor region 22 through the connecting hole 24 and the interlayer insulating layer 23. The metallic interconnection layer 27 containing Al is deposited on the TiN layer 43 by sputtering or the like.

The metallic interconnection layer 27 containing Al is made of Al—Si containing 1% of Si or Al—Si—Cu.

The thickness of the interlayer insulating layer 23, i.e., the depth of the connecting hole 24, is 500 nm, for example. The Ti layer 41, the TiON layer 42, and the TiN layer 43 have respective thicknesses of 30 nm, 70 nm, and 15 nm, for example.

The layers 41, 42, 43, 27 are etched to a predetermined pattern from the side of the metallic interconnection layer 27 by way of anisotropic dry etching, e.g., reactive ion etching (RIE).

A thermally oxidized device-separating thick insulating layer 28, i.e., LOCOS, is formed on the Si semiconductor substrate 21. A channel-stop region 29 of a high impurity concentration is disposed on the Si semiconductor substrate 21 beneath the thick insulating layer 28.

An interconnection structure according to a second embodiment of the present invention and a method of manufacturing such an interconnection structure will be described below with reference to FIG. 4.

Figure 4:
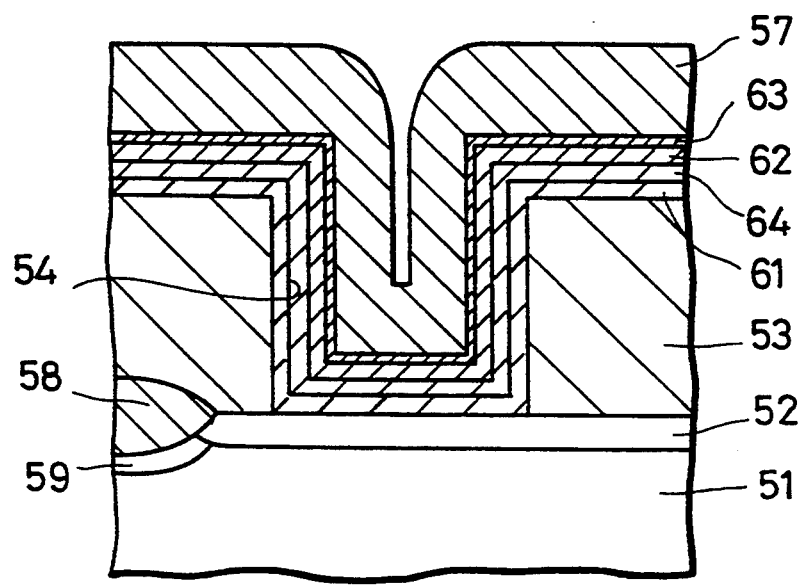
FIG. 4 is a fragmentary cross-sectional view of an interconnection structure according to a second embodiment of the present invention.

As shown in FIG. 4, the interconnection structure includes a semiconductor substrate 51 including a semiconductor region 52 as a contact region. The interconnection structure also includes a metallic interconnection layer 57 containing Al which is connected to the semiconductor region 52 through a connecting hole 54 defined in an interlayer insulating layer 53 that is deposited on the semiconductor substrate 51.

A Ti layer 61, a lower TiN layer 64, a TiON layer 62, and an upper TiN layer 63 are deposited successively in the order named on the semiconductor region 52 through the connecting hole 54 and the interlayer insulating layer 53. The metallic interconnection layer 57 containing Al is deposited on the upper TiN layer 63.

The metallic interconnection layer 57 containing Al is made of Al—Si containing 1% of Si or Al—Si—Cu.

The thickness of the interlayer insulating layer 53, i.e., the depth of the connecting hole 54, is 500 nm, for example. The Ti layer 61, the lower TiN layer 64, the TiON layer 62, and the upper TiN layer 63 have respective thicknesses of 30 nm, 10 nm ~ 15 nm, 70 nm, and 15 nm, for example.

The layers 61, 64, 62, 63, 57 are etched to a predetermined pattern from the side of the metallic interconnection layer 57 by way of anisotropic dry etching, e.g., RIE.

The interconnection structure is manufactured as follows:

As shown in FIG. 4, the Ti layer 61 and the lower TiN layer 64 are successively deposited by sputtering or the like on the semiconductor region 52, i.e., the contact region, through the connecting hole 54 and the interlayer insulating layer 53. Thereafter, the upper surface of the lower TiN layer 64 is thermally oxidized to form the TiON layer 62.

Subsequently, the upper TiN layer 63 and the metallic interconnection layer 57 containing Al, which may be made of Al—Si containing 1% of Si or Al—Si—Cu, are successively deposited on the TiON layer 62.

The lower TiN layer 64 is thermally oxidized as follows: After the lower TiN layer 64 has been deposited, the wafer is fed into an oxidizing atmosphere to oxidize the lower TiN layer 64.

Figure 5:
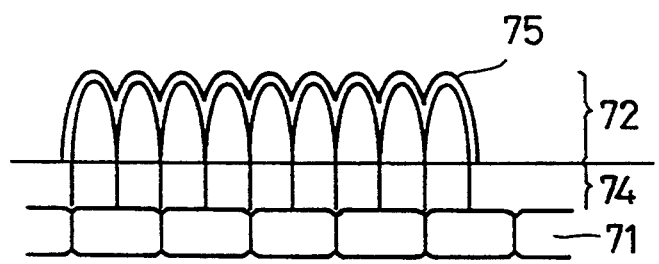
FIG. 5 is an enlarged schematic cross-sectional view showing the manner in which the surface of a TiN layer is oxidized.

More specifically, as schematically shown in FIG. 5, a TiN layer 74 which has been deposited by sputtering has a columnar crystal structure. When it is oxidized in an oxidizing atmosphere, the upper surface of the TiN layer 74 is oxidized, and an oxidizing substance 75 enters the grain boundaries, promoting the oxidization. Therefore, by controlling an oxidizing condition, e.g., an oxidizing time, a TiON layer 72 having a desired thickness can be formed on the upper surface of the TiN layer 74.

When the assembly with the TiN layer 64 deposited is fed into the oxidizing atmosphere, the semiconductor substrate 51 is prevented from being exposed to the atmosphere. In this manner, moisture is prevented from being deposited on the semiconductor substrate 51, and the surface of the semiconductor substrate 51 is prevented from being roughened. Furthermore, the interconnection layer is prevented from suffering an adhesion failure due to degasification, and hence from being subsequently corroded due to an adhesion failure.

A specific example of the process of manufacturing the interconnection structure will be described below.

An interlayer insulating layer 53 of $SiO_2$ having a thickness of about 0.5 μm was deposited on a silicon substrate 51 including an impurity-diffused region 52 by chemical vapor deposition (CVD) or the like. A connecting hole 54 was then defined in the interlayer insulating layer 53 over the impurity-diffused region 52. Thereafter, a Ti layer 61 and a TiN layer 64 were successively deposited on the surface formed so far.

The Ti layer 61 and the TiN layer 64 were deposited, using a single-wafer sputtering apparatus, by successively varying the composition of a gas supplied to a sputtering chamber in which a Ti target was placed. Therefore, the Ti layer 61 and the TiN layer 64 were successively deposited without allowing the substrate 51 to the atmosphere. The single-wafer sputtering apparatus is of the multichamber type having an RF plasma/cleaning chamber for pretreating the wafer, a first sputtering chamber for depositing a barrier metal layer, and a second sputtering chamber for depositing a layer composed of Al and 1% of Si, these chambers being interconnected by a wafer handling unit.

More specifically, to pretreat the wafer, the wafer was set in the RF plasma/cleaning chamber, and a naturally oxidized film covering the bottom of the connecting hole 54 was removed in the RF plasma/cleaning chamber. Then, the wafer was transferred through a vacuum into the first sputtering chamber, in which the Ti layer 61 was deposited on interlayer insulating layer 53 and the semiconductor region 52. Thereafter, an $N_2$ gas was introduced into the first sputtering chamber, and the TiN layer 64 was deposited on the Ti layer 61 in the first sputtering chamber.

Then, while the wafer was being kept in the first sputtering chamber, the supply of electric energy to the target was interrupted, and $O_2$ was introduced into the first sputtering chamber at a rate of 100 SCCM for one minute. The surface of the TiN layer 64 was oxidized in the manner described above with reference to FIG. 5, thereby forming the TiON layer 62 as shown in FIG. 4, i.e., the TiON layer 72 in FIG. 5. While the Ti layer 61 (71 in FIG. 5) has a planar crystal structure as shown in FIG. 5, the surface-oxidized TiON layer 62 has a columnar crystal structure. The surface-oxidized TiON layer 62 was formed of TiN crystal grains in the TiN layer 64 as they were oxidized inwardly from their upper surfaces and grain boundaries. Some of the oxygen atoms are segregated into the crystal boundaries.

Subsequently, the TiN layer 63 was deposited on the TiON layer 62 in the first sputtering chamber. Thereafter, the wafer was transferred to the second sputtering chamber, in which the interconnection layer 57 of Al and 1% of Si was deposited by sputtering.

In the above embodiments, the interconnection layer is connected by way of ohmic contact to the semiconductor region through the connecting hole in the interlayer insulating layer. However, the principles of the present invention are an applicable to an interconnection structure in which a metallic layer or a thin semiconductor film is connected the contact region by way of ohmic contact.

According to the present invention, as described above, the TiN layer which has good wettability with the metallic interconnection layer containing Al is disposed beneath the metallic interconnection layer. Therefore, the metallic interconnection layer is held in contact with the TiN layer therebeneath with high mechanical and electrical reliability.

In the first embodiment, the Ti layer, the TiON layer, and the TiN layer are deposited successively in order named on the semiconductor substrate below the metallic interconnection layer. In the second embodiment, the Ti layer, the lower TiN layer, the TiON layer, and the upper TiN layer are deposited successively in order named on the semiconductor substrate below the metallic interconnection layer. In each of the first and second embodiments, since the TiON layer having a good barrier capability is included for effectively preventing Al in the metallic interconnection layer and Si in the substrate from being mutually diffused is present, the thickness of a base layer-disposed underneath the metallic interconnection layer containing Al may be reduced, and the metallic interconnection layer containing Al may be deposited in the connecting hole with a good coverage.

Inasmuch as the TiON layer in the interconnection structure according to the second embodiment is formed by oxidizing the surface of the lower TiN layer, the interconnection structure can be manufactured efficiently, and the TiON layer adheres well to the TiN layer.

Having described preferred embodiments of the invention with reference to the accompanying drawings, it is to be understood that the invention is not limited to those precise embodiments and that various changes and modifications could be effected by one skilled in the art without departing from the spirit or scope of the invention as defined in the appended claims.

What is claimed is:

1. An interconnection structure comprising:
a semiconductor substrate including an upper surface, a semiconductor region defined within the substrate and spaced inwardly from said upper surface and a connecting hole defined in said substrate and extending inwardly from a top opening defined in said upper surface to an opposed inner end wall defined by an exposed portion of said semiconductor region, said connecting hole being further defined by a substrate sidewall extending between said top opening and said inner end wall; said interconnection structure further comprising a multilayer covering disposed in and about the contact hole and including: a first Ti layer disposed in said connecting hole and extending on said upper surface, along said substrate sidewall and on said inner end wall; a second TiON layer disposed on said first Ti layer and continuous with said first Ti layer; a third TiN layer disposed on said second TiON layer and continuous with said second TiON layer; and a metallic interconnection layer containing Al disposed on said third TiN layer and continuous with said third TiN layer.

2. An interconnection structure according to claim 1, wherein said metallic interconnection layer is made of Al and 1% of Si.

3. An interconnection structure according to claim 1, wherein said metallic interconnection layer is made of Al—Si—Cu.

* * * * *